United States Patent
Cheng (10) Patent No.: US 10,210,790 B2
(45) Date of Patent: Feb. 19, 2019

(54) PIXEL UNITS COMPRISING A COMPENSATION CIRCUIT AND ELECTROLUMINESCENT DISPLAY COMPRISING THE PIXEL UNITS

(71) Applicant: INT TECH CO., LTD., Taipei (TW)

(72) Inventor: Shih-Song Cheng, Kaohsiung (TW)

(73) Assignee: INT TECH CO., LTD., Taipei (TW)

(*) Notice: Subject to any disclaimer, the term of this patent is extended or adjusted under 35 U.S.C. 154(b) by 102 days.

(21) Appl. No.: 15/440,543

(22) Filed: Feb. 23, 2017

(65) Prior Publication Data

US 2018/0137806 A1    May 17, 2018

Related U.S. Application Data

(60) Provisional application No. 62/421,435, filed on Nov. 14, 2016.

(51) Int. Cl.
*G06F 3/14* (2006.01)
*G09G 3/20* (2006.01)
(Continued)

(52) U.S. Cl.
CPC ......... *G09G 3/2092* (2013.01); *G06F 3/1446* (2013.01); *G09G 3/30* (2013.01);
(Continued)

(58) Field of Classification Search
CPC ...... G09G 3/3233; G09G 3/3201; G09G 3/30; G09G 2320/045; G09G 2300/0814;
(Continued)

(56) References Cited

U.S. PATENT DOCUMENTS

| | | | | |
|---|---|---|---|---|
| 2005/0067970 A1* | 3/2005 | Libsch | ............... | G09G 3/3233 315/169.3 |
| 2014/0145918 A1* | 5/2014 | Kwak | ............... | G09G 3/3233 345/82 |
| 2014/0152642 A1 | 6/2014 | Kim et al. | | |

FOREIGN PATENT DOCUMENTS

| | | |
|---|---|---|
| TW | 200705348 A | 2/2007 |
| TW | 201133449 A1 | 10/2011 |
| TW | 201218163 A1 | 5/2012 |

OTHER PUBLICATIONS

Office Action and search report dated Jul. 4, 2018, issued in counterpart Taiwanese Patent Application No. 106129400, (5 pages) with English translation. (2 pages).

\* cited by examiner

*Primary Examiner* — Laurence J Lee
(74) *Attorney, Agent, or Firm* — Juan Carlos A. Marquez; Marquez IP Law Office, PLLC (57) ABSTRACT

An electroluminescent display includes an array of pixels, each including a capacitor, an electroluminescent (EL) device, a first group of transistors and a second group of transistors. The first group of transistors, coupled between a first terminal of the capacitor and a data input, provides a compensation voltage according to data received at the data input. The compensation voltage is composed of a threshold voltage of each of the first group of transistors. The second group of transistors passes a current through the EL device that has a magnitude independent of a threshold voltage of the second group of transistors. In a first phase, a voltage level at the first terminal of the capacitor is reset. In a second phase, data is stored in the capacitor and received via the first group of transistors, and the compensation voltage is generated. In a third phase, the current is passed.

17 Claims, 7 Drawing Sheets

(51) Int. Cl.
    *G09G 3/30*       (2006.01)
    *G09G 3/36*       (2006.01)
    *H01L 27/32*      (2006.01)
    *H01L 29/78*      (2006.01)
    *H01L 51/50*      (2006.01)
    *G09G 3/3208*     (2016.01)
    *H01L 23/528*     (2006.01)
    *H01L 29/417*     (2006.01)

(52) U.S. Cl.
    CPC ........ *H01L 23/528* (2013.01); *H01L 27/3211* (2013.01); *H01L 27/3248* (2013.01); *H01L 29/41733* (2013.01); *H01L 29/78* (2013.01); *H01L 51/5036* (2013.01); *G09G 3/3208* (2013.01); *G09G 3/3611* (2013.01); *G09G 2300/026* (2013.01); *G09G 2300/0439* (2013.01); *G09G 2300/0819* (2013.01); *G09G 2310/0278* (2013.01); *G09G 2320/0204* (2013.01); *G09G 2320/029* (2013.01); *G09G 2320/0233* (2013.01); *G09G 2320/045* (2013.01); *G09G 2330/02* (2013.01); *H01L 27/3244* (2013.01)

(58) Field of Classification Search
    CPC ... G09G 2300/0819; G09G 2320/0233; G09G 2300/0842; G09G 2320/0204
    See application file for complete search history.

PIXEL UNITS COMPRISING A COMPENSATION CIRCUIT AND ELECTROLUMINESCENT DISPLAY COMPRISING THE PIXEL UNITS

CROSS REFERENCE TO RELATED APPLICATIONS

This application claims priority to U.S. provisional application Ser. No. 62/421,435, filed Nov. 14, 2016, the disclosure of which is hereby incorporated herein by reference.

BACKGROUND

An electroluminescent (EL) display, such as an active matrix organic light emitting diode (AMOLED) display, may include an array of pixels. In addition, each of the pixels may include an EL device, a switching transistor for transfer data that contains information on luminescence, and a driving transistor for driving the EL device to emit light according to the data. While such EL display enjoys the benefit of relatively low power consumption, display non-uniformity may exist among pixels due to process factors in semiconductor manufacturing. It may thus be desirable to have a circuit that solves the problem.

SUMMARY

Embodiments of the present invention provide a circuit that includes a capacitor, an electroluminescent (EL) device, a first group of transistors and a second group of transistors. The first group of transistors, coupled between a first terminal of the capacitor and a data input, is configured to provide a compensation voltage in response to data received at the data input. The compensation voltage is composed of a threshold voltage each of the first group of transistors. The second group of transistors, coupled between the EL device and the second terminal of the capacitor, is configured to pass a current through the EL device via the second group of transistors. The current has a magnitude independent of a threshold voltage each of the second group of transistors.

In an embodiment, a gate each of the first group of transistors is coupled to the first terminal of the capacitor.

In another embodiment, a gate each of the second group of transistors is coupled to the first terminal of the capacitor.

In yet another embodiment, the first group of transistors includes a first transistor, a second transistor and a third transistor. In addition, the compensation voltage is a summation of the threshold voltages of the first, second and third transistors.

In still another embodiment, the second group of transistors includes the first transistor, a fourth transistor and a fifth transistor. In addition, the compensation voltage substantially equals a summation of the threshold voltages of the first, fourth and fifth transistors.

In an embodiment, the circuit further includes a transistor configured to, in response to a first control signal, reset a voltage level at the first terminal of the capacitor.

In another embodiment, the circuit further includes transistors configured to, in response to a second control signal, allow the data to be stored in the capacitor via the first group of transistors.

In yet another embodiment, the circuit further includes transistors configured to, in response to a third control signal, allow the current to pass through the EL device via the second group of transistors.

In an embodiment, each of the first group of transistors and each of the second group of transistors include a p-type transistor.

In another embodiment, each of the first group of transistors and each of the second group of transistors include an n-type transistor.

Some embodiments of the present invention provide an electroluminescent display that comprises an array of pixels. Each of the pixels includes a capacitor, an electroluminescent (EL) device, a first group of transistors and a second group of transistors. The first group of transistors, coupled between a first terminal of the capacitor and a data input, is configured to provide a compensation voltage in response to data received at the data input. The compensation voltage is composed of a threshold voltage each of the first group of transistors. The second group of transistors, coupled between the EL device and the second terminal of the capacitor, is configured to pass a current through the EL device via the second group of transistors. The current has a magnitude independent of a threshold voltage each of the second group of transistors.

Embodiments of the present invention also provide a method of voltage compensation in an electroluminescent (EL) display. The EL display comprises pixels each including a capacitor, an EL device, a first group of transistors and a second group of transistors. According to the method, a voltage level at a first terminal of the capacitor is reset during a first phase. A data is stored in the capacitor during a second phase. The data is received via the first group of transistors. Also, a compensation voltage composed of a threshold voltage each of the first group of transistors is generated during the second phase. Moreover, a current is passed through the EL device via the second group of transistors during a third phase. The current has a magnitude independent of a threshold voltage each of the second group of transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

In the below description, a signal is asserted with a logical high value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

Figure 1:
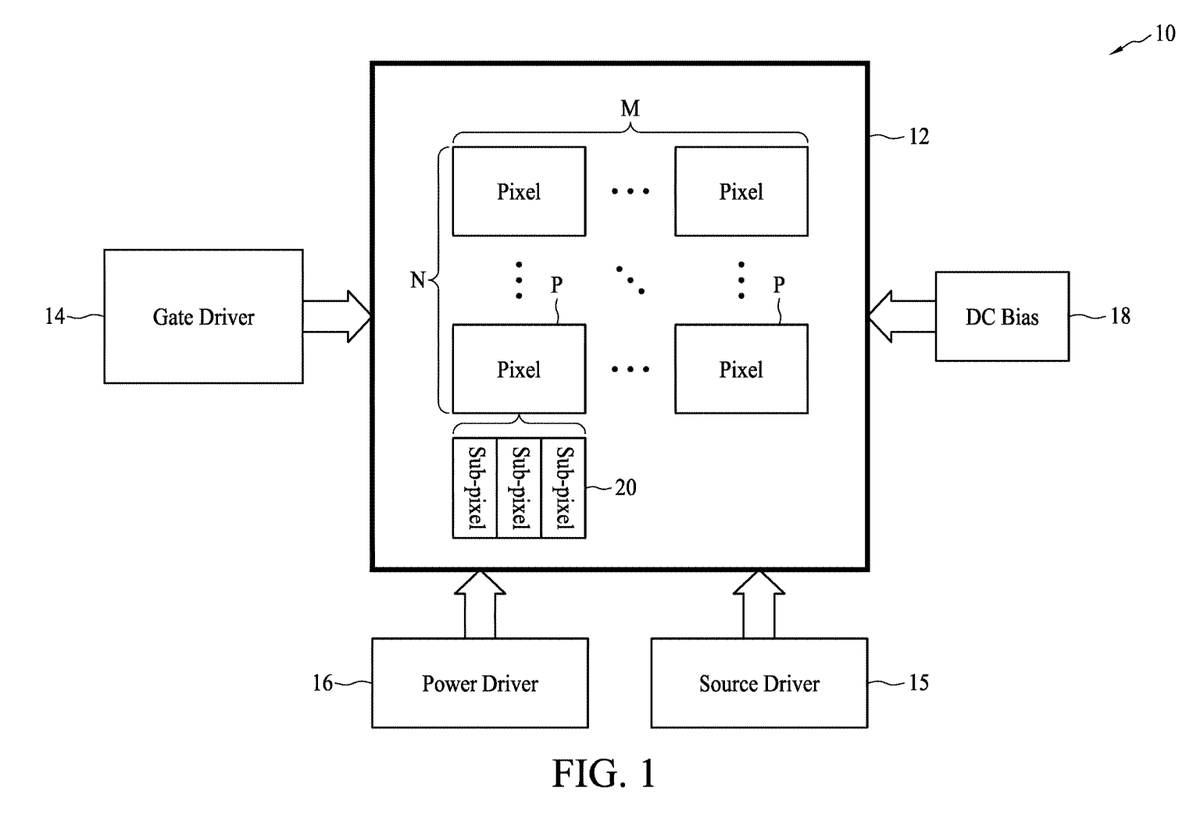
FIG. 1 is a block diagram of a display, in accordance with an embodiment.

FIG. 1 is a block diagram of a display 10, in accordance with an embodiment. The display 10 may include an electroluminescent (EL) display, for example, an active matrix organic light emitting diode (AMOLED) display.

Referring to FIG. 1, the display 10 includes an active area 12, a gate driver 14 and a source driver 15. The active area 12 includes an array of pixel units P arranged in, for example, an N×M matrix. The gate driver 14 provides control signals S1, S2 and EM through N scan lines to the N rows of pixel units. The source driver 15 provides data to a selected pixel of the M columns of pixel units. Moreover, a power driver 16 provides supply voltages in a power rail of VDD and VSS to the active area 12, and a DC bias source 18 provides a reference voltage Vref, for example, ground level, to the active area 12. In an embodiment, VDD is approximately five volts (5V), VSS is approximately −5V, and Vref is approximately 0V.

Each pixel unit P in the active area 12 includes three sub-pixel units, which may be used to display color red (R), color green (G) and color blue (B). In other embodiments, for example, in a sub-pixel rendering (SPR) sensor, the number of sub-pixel units is not limited to three. In the present embodiment, the three sub-pixels are arranged along the row direction. Accordingly, the number of data lines for the source driver 15 is 3×M.

Figure 2:
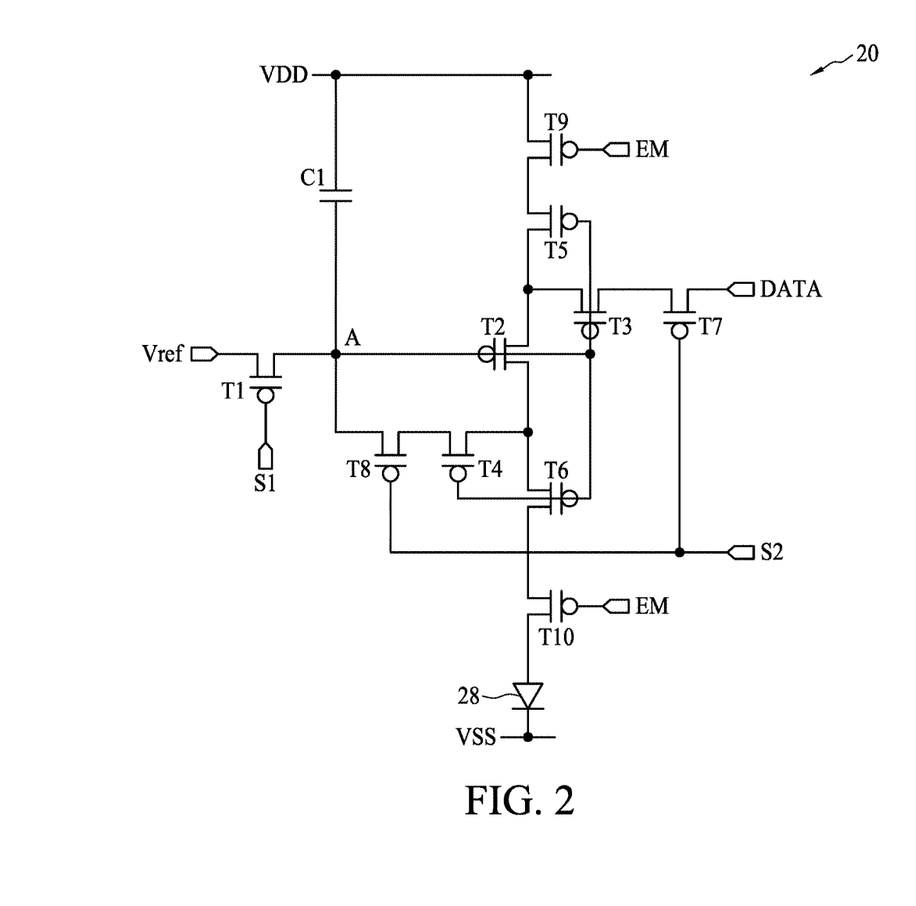
FIG. 2 is a circuit diagram of a sub-pixel unit in the display illustrated in FIG. 1, in accordance with an embodiment.

FIG. 2 is a circuit diagram of an exemplary sub-pixel unit 20 in the display 10 illustrated in FIG. 1, in accordance with an embodiment.

Referring to FIG. 2, the circuit includes an EL device 28, transistors T1 to T10 and a capacitor C1. The EL device 28 includes, for example, a current-driven element that may include an organic light emitting diode (OLED), a micro LED or a quantum dot LED (QLED). The capacitor C1, coupled between VDD and a node A, serves as a storage capacitor. In an embodiment, the capacitance of capacitor C1 is approximately 0.5 picofarads (pF). In addition, the transistors T2, T5 and T6, cascade connected, serve as driving transistors for driving the EL device 28 according to data stored in the capacitor C1. In the present embodiment, each of the transistors T1 to T10 includes a p-type thin film transistor (TFT) or a p-type metal-oxide-semiconductor (PMOS) transistor.

A gate of the transistor T1 receives the control signal S1. A drain of the transistor T1 receives a reference voltage Vref from the DC bias source 18. A source of the transistor T1 is coupled to the node A. Persons having ordinary skill in the art will understand that drain and source terminals of a MOS transistor may be interchangeable, depending on voltage levels applied thereto.

Moreover, a gate each of the transistors T2, T3, T4, T5 and T6 is coupled to the node A. A source of the transistor T2 is coupled to a drain each of the transistors T3 and T5. A drain of the transistor T2 is coupled to a source each of the transistors T6 and T4.

In addition, a gate each of the transistors T7 and T8 receives the control signal S2. A source of the transistor T7 receives data (labeled "DATA") on a corresponding data line from the source driver 15. A drain of the transistor T7 is coupled to a source of the transistor T3. Moreover, a source of the transistor T8 is coupled to a drain of the transistor T4. A drain of the transistor T8 is coupled to the node A.

Furthermore, a gate each of the transistors T9 and T10 receives the control signal EM. A source of the transistor T9 receives VDD. A drain of the transistor T9 is coupled to a source of the transistor T5. In addition, a source of the transistor T10 is coupled to a drain of the transistor T6. A drain of the transistor T10 is coupled to an anode of the EL device 28. A cathode of the EL device 28 is coupled to VSS.

Figure 3A:
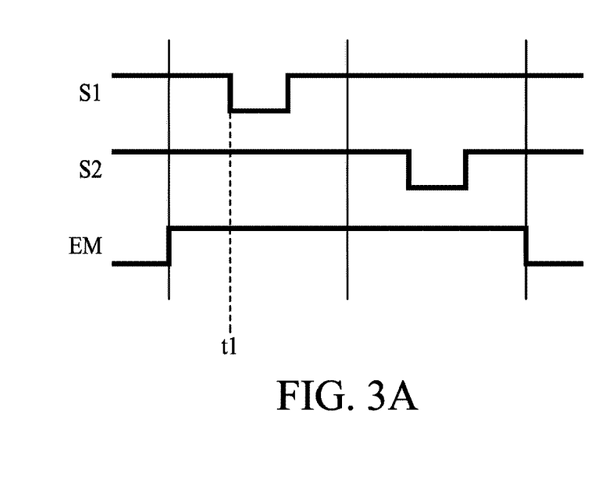
FIGS. 3A and 3B are diagrams showing a method of operating the circuit illustrated in FIG. 2 in a first phase, in accordance with some embodiments.
Figure 3B:
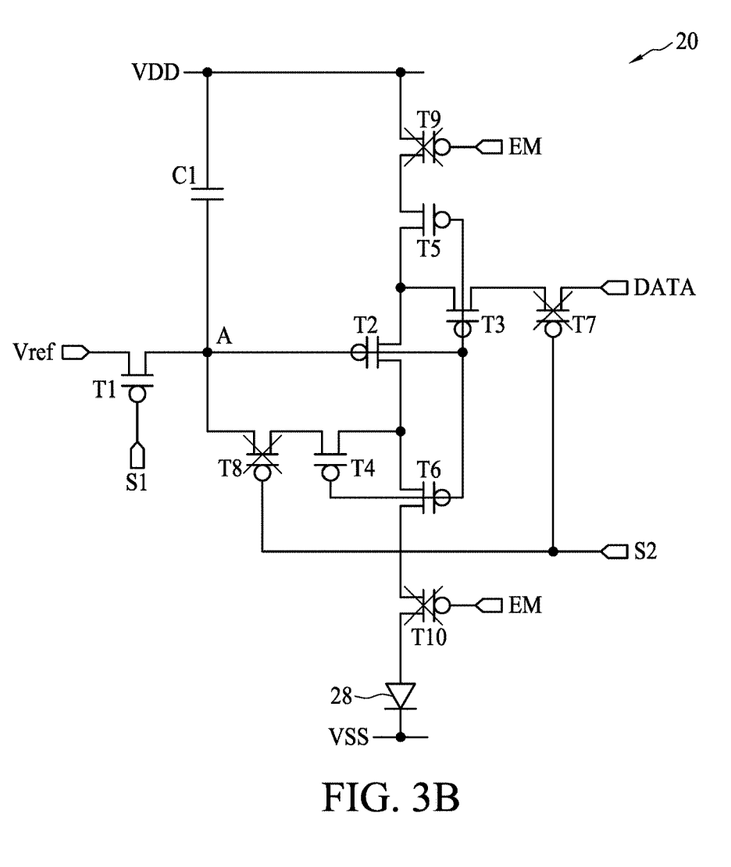

FIGS. 3A and 3B are diagrams showing a method of operating the circuit 20 illustrated in FIG. 2 in a first phase, in accordance with some embodiments.

Referring to FIG. 3A, the control signals S1, S2 and EM are configured to be active low. At time t1, the control signal S1 is asserted at a falling edge and the control signals S2 and EM at a high logical level are not asserted. As a result, referring to FIG. 3B, the transistor T1 is turned on, while the transistors T7 to T10 are turned off (shown by a cross sign "×" labeled). Since the transistor T1 is turned on, the voltage level at node A, hereinafter denoted as VA, is pulled low to Vref. Moreover, since the gates of transistors T2 to T6 are connected to node A, the voltage level at the gates of the driving transistors T2, T5 and T6, denoted as Vg, is reset to Vref during the first phase. The capacitor C1 facilitates to maintain VA and Vg at the voltage level of Vref. Effectively, VA and Vg are reset to Vref during the first phase.

Figure 4A:
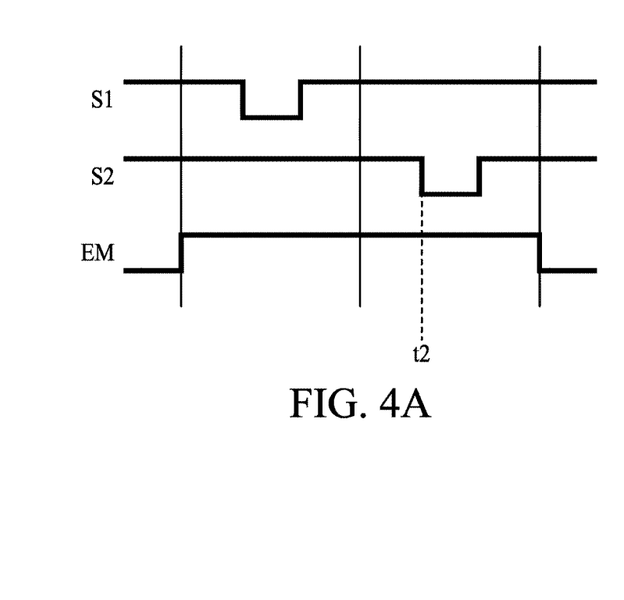
FIGS. 4A and 4B are diagrams showing a method of operating the circuit illustrated in FIG. 2 in a second phase, in accordance with some embodiments.
Figure 4B:
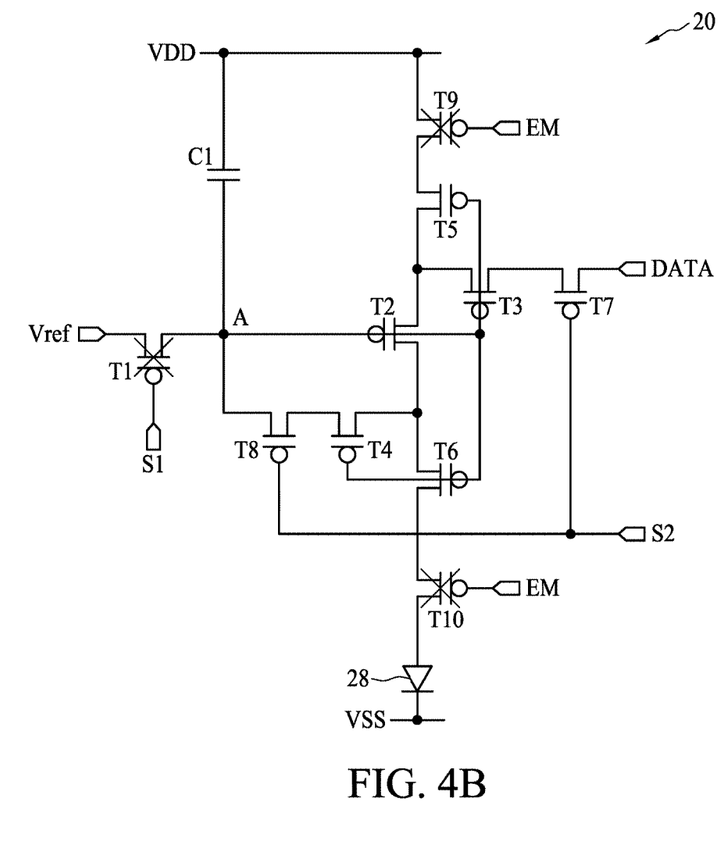

FIGS. 4A and 4B are diagrams showing a method of operating the circuit 20 illustrated in FIG. 2 in a second phase, in accordance with some embodiments.

Referring to FIG. 4A, at time t2, the control signal S2 is asserted at a falling edge and the control signals S1 and EM at a high logical level are not asserted. As a result, referring to FIG. 4B, the transistor T1 is turned off, while the transistors T7 and T8 are turned on. The transistors T2, T3 and T4 are kept at an on state due to their gates biased at Vref initially in the second phase. Since the transistors T7 and T8 are turned on, data is written to the capacitor C1 via the transistors T7, T3, T2, T4 and T8. As a result, VA, and also Vg, at the end of the second phase can be expressed in equation (1) below.

$$VA = Vg = V\text{data} - (|Vth2| + |Vth3| + |Vth4|) \quad \text{equation (1)}$$

where Vdata represents the voltage level of the data received at the transistor T7, and |Vth2|, |Vth3| and |Vth4| represent the threshold voltages of the transistors T2, T3 and T4, respectively. In an embodiment, Vdata ranges from approximately 2V to approximately 5V, and |Vth2|, |Vth3| and |Vth4| are each approximately 0.6V.

The term (|Vth2|+|Vth3|+|Vth4|) associated with the transistors T2, T3 and T4 is called a compensation voltage, which will be further discussed below with reference to FIGS. 5A and 5B.

Figure 5A:
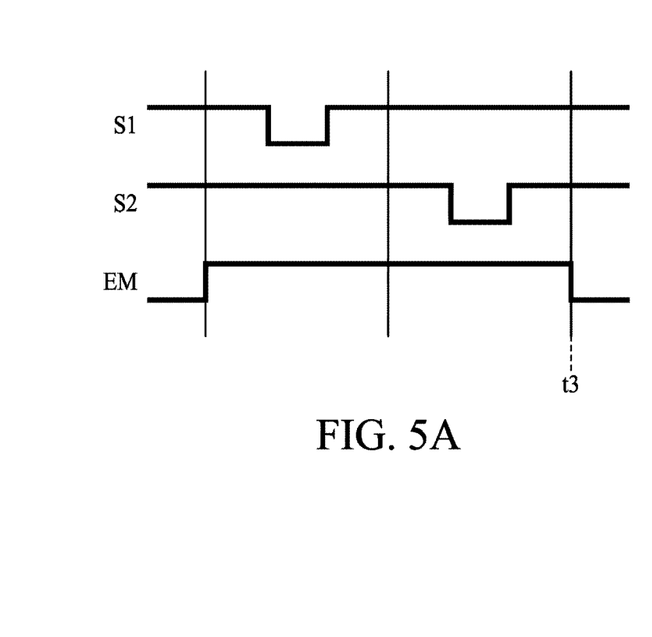
FIGS. 5A and 5B are diagrams showing a method of operating the circuit illustrated in FIG. 2 in a third phase, in accordance with some embodiments.
Figure 5B:
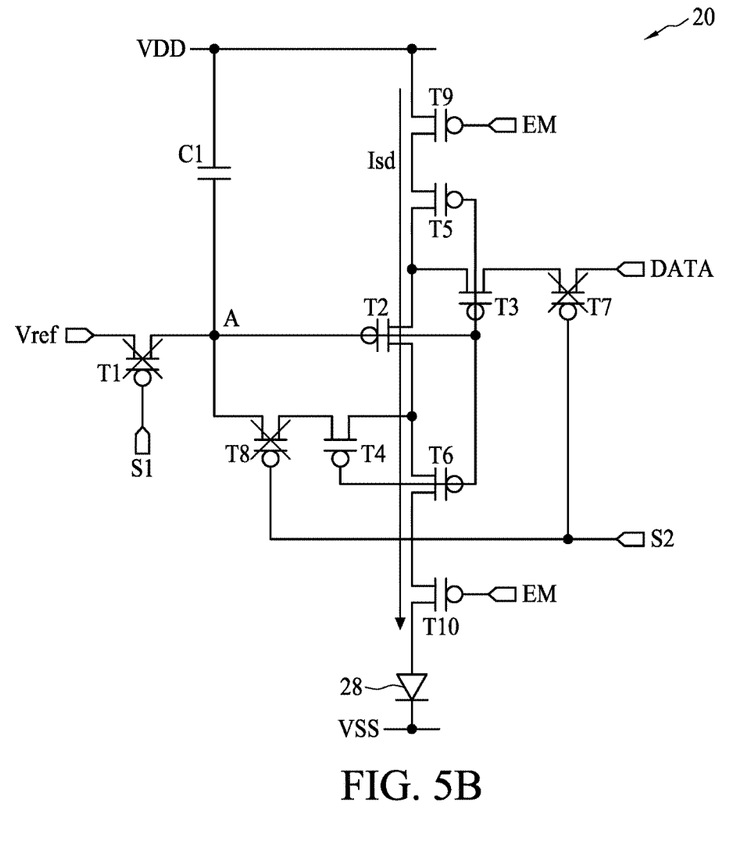

FIGS. 5A and 5B are diagrams showing a method of operating the circuit 20 illustrated in FIG. 2 in a third phase, in accordance with some embodiments.

Referring to FIG. 5A, at time t3, the control signal EM is asserted at a falling edge and the control signals S1 and S2 at a high logical level are not asserted. As a result, referring to FIG. 5B, the transistors T1, T7 and T8 are turned off, while the transistors T9 and T10 are turned on. For the transistors T2, T5 and T6, since the gate voltage level Vg is Vdata−(|Vth2|+|Vth3|+|Vth4|) and the source voltage level Vs is approximately VDD, resulting in |Vgs|>|Vth|, the driving transistors T2, T5 and T6 are kept at an on state. As a result, current flows from the supply power VDD through the EL device 28 to VSS via the transistors T9, T5, T2, T6 and T10, which causes the EL device 28 to emit light. Vg is kept at Vdata−(|Vth2|+|Vth3|+|Vth4|) during the third phase by function of the capacitor C1.

The current Isd flowing through the EL device 28 can be expressed in equation (2) below.

$$|Isd| = k \times [|Vsg| - (|Vth2| + |Vth5| + |Vth6|)]^2 \quad \text{equation (2)}$$

where k is a constant, and |Vth5| and |Vth6| represent the threshold voltages of the transistors T5 and T6, respectively.

Since |Vsg|=VDD−Vdata+(|Vth2|+|Vth3|+|Vth4|), equation (2) can be rewritten as equation (3) as follows.

$$|Isd| = k \times [VDD - V\text{data} + (|Vth3| + |Vth4|) - (|Vth5| + |Vth6|)]^2 \quad \text{equation (3)}$$

By, for example, controlling device feature such as channel length in semiconductor manufacturing, the terms (|Vth3|+|Vth4|) and (|Vth5|+|Vth6|) in equation (3) can be counter canceled. As a result, equation (3) can be further rewritten as equation (4) below.

$$|Isd| = k \times [VDD - V\text{data}]^2 \quad \text{equation (4)}$$

Since equation (4) is free of those Vth terms as in equation (2) or equation (3), display quality of the display 10 is enhanced.

As a result, embodiments of the present invention provide a circuit that includes a capacitor C1, an electroluminescent (EL) device 28, a first group of transistors T2, T3 and T4 and a second group of transistors T2, T5 and T6. The first group of transistors, coupled between a first terminal (connected to node A) of the capacitor and a data input, is configured to provide a compensation voltage in response to data received at the data input. The compensation voltage is composed of a threshold voltage each of the first group of transistors. The second group of transistors T2, T5 and T6, coupled between the EL device and the second terminal (connected to VDD) of the capacitor, is configured to pass a current through the EL device via the second group of transistors. The current has a magnitude independent of a threshold voltage each of the second group of transistors.

Figure 6A:
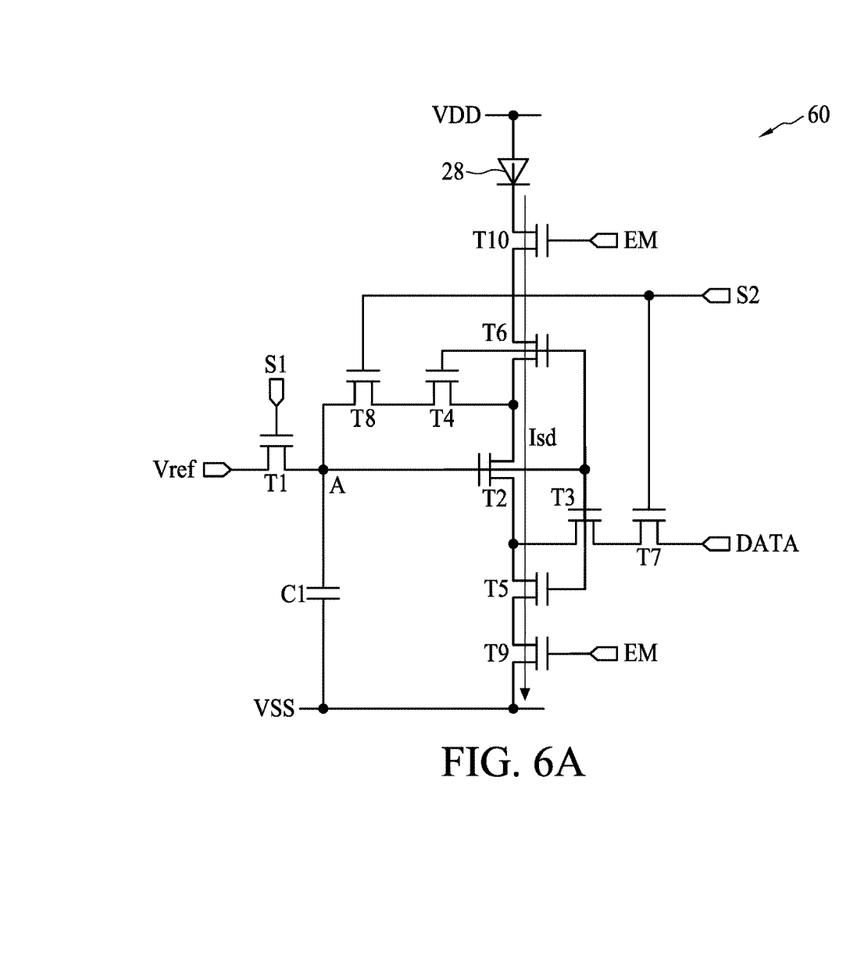
FIG. 6A is a circuit diagram of a sub-pixel unit in a display, in accordance with another embodiment.

FIG. 6A is a circuit diagram of a sub-pixel unit 60 in a display, in accordance with another embodiment.

Referring to FIG. 6A, the circuit is similar to the circuit 20 described and illustrated with reference to FIG. 2 except that, for example, n-type TFTs or n-type metal-oxide-semiconductor (NMOS) transistors replace the p-type TFTs or PMOS transistors T1 to T10 in FIG. 2. Specifically, a gate of the transistor T1 receives the control signal S1. A source of the transistor T1 receives a reference voltage Vref from the DC bias source 18. A drain of the transistor T1 is coupled to the node A. Moreover, a gate each of the transistors T2, T3, T4, T5 and T6 is coupled to the node A. A source of the transistor T2 is coupled to a source of the transistor T3 and to a drain of the transistor T5. A drain of the transistor T2 is coupled to a source of the transistor T6 and to a drain of the transistor T4.

In addition, a gate each of the transistors T7 and T8 receives the control signal S2. A drain of the transistor T7 receives data (labeled "DATA") on a corresponding data line from the source driver 15. A source of the transistor T7 is coupled to a drain of the transistor T3. Also, a source of the transistor T8 is coupled to the node A. A drain of the transistor T8 is coupled to a source of the transistor T4.

Furthermore, a gate each of the transistors T9 and T10 receives the control signal EM. A source of the transistor T9 receives VSS. A drain of the transistor T9 is coupled to a source of the transistor T5. In addition, a source of the transistor T10 is coupled to a drain of the transistor T6. A drain of the transistor T10 is coupled to a cathode of the EL device 28. An anode of the EL device 28 is coupled to VDD.

Figure 6B:
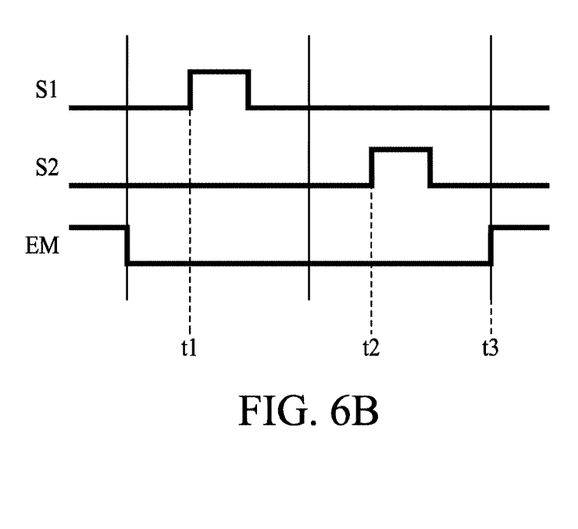
FIG. 6B is a waveform diagram of control signals for operating the circuit illustrated in FIG. 6A, in accordance with some embodiments.

FIG. 6B is a waveform diagram of the control signals for operating the circuit illustrated in FIG. 6A, in accordance with some embodiments.

Referring to FIG. 6B, the control signals S1, S2 and EM are similar to those described and illustrated with reference to FIG. 3A, 4A or 5A except that, for example, the control signals S1, S2 and EM in FIG. 6B are active high or asserted at a rising edge. Similarly, the current Isd flowing through the EL device 28 can be expressed in equation (5) below.

$$|Isd| = k \times [VDD - V\text{data} + (|Vth3| + |Vth4|) - (|Vth5| + |Vth6|)]^2 \quad \text{equation (5)}$$

By controlling device feature such as channel length in semiconductor manufacturing, the terms (|Vth3|+|Vth4|) and (|Vth5|+|Vth6|) in equation (3) can be counter canceled. As a result, equation (5) can be further rewritten as equation (6) below.

$$|Isd| = k \times [VDD - VSS]^2 \quad \text{equation (6)}$$

Figure 7:
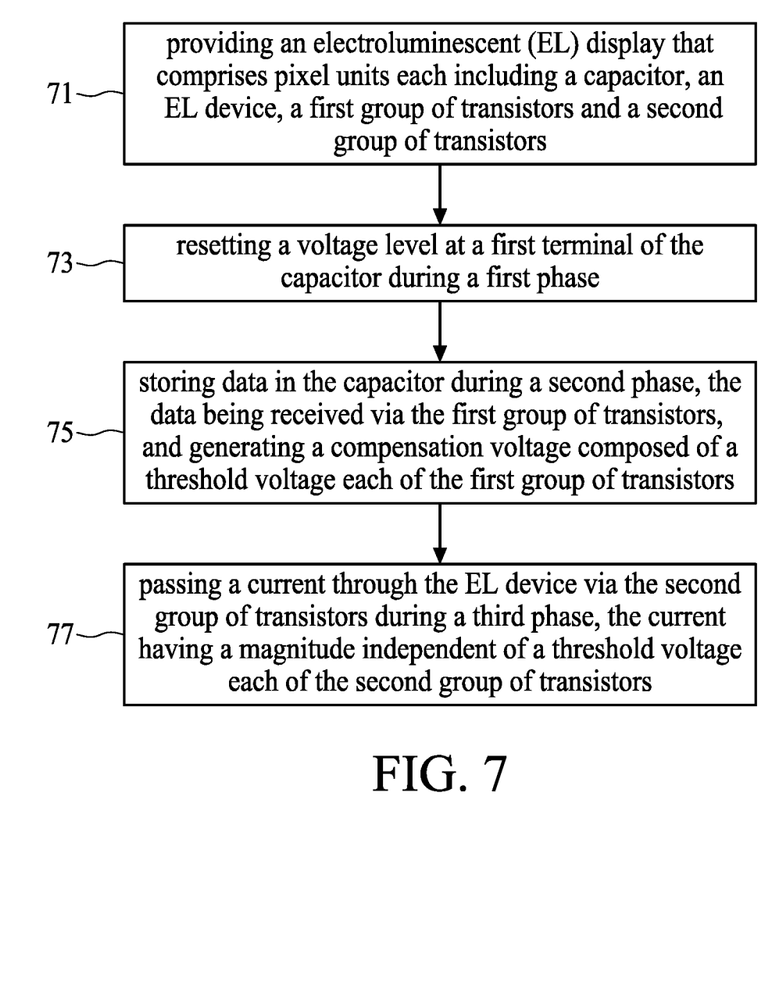
FIG. 7 is a flow diagram showing a method of voltage compensation in an electroluminescent display.

FIG. 7 is a flow diagram showing a method of voltage compensation in an electroluminescent display.

Referring to FIG. 7, in operation 71, an electroluminescent (EL) display is provided. The EL display comprises pixels each including a capacitor, an EL device, a first group of transistors and a second group of transistors.

In operation 73, a voltage level at a first terminal of the capacitor is reset during a first phase.

In operation 75, a data is stored in the capacitor during a second phase. The data is received via the first group of transistors. Moreover, a compensation voltage composed of a threshold voltage each of the first group of transistors is generated during the second phase.

In operation 77, a current is allowed to pass through the EL device via the second group of transistors during a third phase. The current has a magnitude independent of a threshold voltage each of the second group of transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
a capacitor including a first terminal and a second terminal;
an electroluminescent (EL) device;
a first group of transistors, coupled between the first terminal of the capacitor and a data input, being configured to provide a compensation voltage in response to data received at the data input, the compensation voltage being composed of a threshold voltage each of the first group of transistors; and
a second group of transistors, coupled between the EL device and the second terminal of the capacitor, being configured to pass a current through the EL device via the second group of transistors, the current having a magnitude being independent of a threshold voltage each of the second group of transistors;
wherein a gate each of the first group of transistors is coupled to the first terminal of the capacitor.

2. The circuit according to claim 1, wherein a gate each of the second group of transistors is coupled to the first terminal of the capacitor.

3. The circuit according to claim 1, wherein the first group of transistors includes a first transistor, a second transistor and a third transistor, and the compensation voltage is a summation of the threshold voltages of the first, second and third transistors.

4. The circuit according to claim 3, wherein the second group of transistors includes the first transistor, a fourth transistor and a fifth transistor, and the compensation voltage substantially equals a summation of the threshold voltages of the first, fourth and fifth transistors.

5. The circuit according to claim 1 further comprising a transistor configured to, in response to a first control signal, reset a voltage level at the first terminal of the capacitor.

6. The circuit according to claim 1 further comprising transistors configured to, in response to a second control signal, allow the data to be stored in the capacitor via the first group of transistors.

7. The circuit according to claim 1 further comprising transistors configured to, in response to a third control signal, allow the current to pass through the EL device via the second group of transistors.

8. The circuit according to claim 1, wherein each of the first group of transistors and each of the second group of transistors include a p-type transistor.

9. The circuit according to claim 1, wherein each of the first group of transistors and each of the second group of transistors include an n-type transistor.

10. An electroluminescent display, comprising:
an array of pixel units, each of the pixel units comprising:
a capacitor including a first terminal and a second terminal;
an electroluminescent (EL) device;
a first group of transistors, coupled between the first terminal of the capacitor and a data input, being configured to provide a compensation voltage in response to data received at the data input, the compensation voltage being composed of a threshold voltage each of the first group of transistors; and
a second group of transistors, coupled between the EL device and the second terminal of the capacitor, being configured to pass a current through the EL device via the second group of transistors, the current having a magnitude being independent of a threshold voltage each of the second group of transistors;
wherein a gate each of the first group of transistors is coupled to the first terminal of the capacitor.

11. The electroluminescent display according to claim 10, wherein a gate each of the second group of transistors is coupled to the first terminal of the capacitor.

12. The electroluminescent display according to claim 10, wherein the first group of transistors includes a first transistor, a second transistor and a third transistor, and the compensation voltage is a summation of the threshold voltages of the first, second and third transistors.

13. The electroluminescent display according to claim 12, wherein the second group of transistors includes the first transistor, a fourth transistor and a fifth transistor, and the compensation voltage substantially equals a summation of the threshold voltages of the first, fourth and fifth transistors.

14. The electroluminescent display according to claim 10, wherein each pixel unit further comprises a transistor configured to, in response to a first control signal, reset a voltage level at the first terminal of the capacitor.

15. The electroluminescent display according to claim 10, wherein each pixel unit further comprises transistors configured to, in response to a second control signal, allow the data to be stored in the capacitor via the first group of transistors.

16. The electroluminescent display according to claim 10, wherein each pixel unit further comprises transistors configured to, in response to a third control signal, allow the current to pass through the EL device via the second group of transistors.

17. A method of voltage compensation in an electroluminescent (EL) display that comprises pixel units each including a capacitor, an EL device, a first group of transistors and a second group of transistors, the method comprising:
resetting a voltage level at a first terminal of the capacitor during a first phase;
storing data in the capacitor during a second phase, the data being received via the first group of transistors;
generating a compensation voltage composed of a threshold voltage each of the first group of transistors during the second phase; and
passing a current through the EL device via the second group of transistors during a third phase, the current having a magnitude being independent of a threshold voltage each of the second group of transistors;
wherein the compensation voltage substantially equals a summation of a threshold voltage each of the second group of transistors.

* * * * *